US006632479B2

(12) United States Patent
Steiger

(10) Patent No.: US 6,632,479 B2
(45) Date of Patent: Oct. 14, 2003

(54) SPRAYING METHOD AND A SPRAY SYSTEM FOR COATING LIQUIDS

(75) Inventor: Ronald Steiger, Gross-Zimmern (DE)

(73) Assignee: ITW Oberflachentechnik GmbH & Co. KG, Dietzenbach (DE)

( * ) Notice: Subject to any disclaimer, the term of this patent is extended or adjusted under 35 U.S.C. 154(b) by 0 days.

(21) Appl. No.: 10/042,393

(22) Filed: Jan. 11, 2002

(65) Prior Publication Data

US 2002/0094386 A1 Jul. 18, 2002

(30) Foreign Application Priority Data

Jan. 13, 2001 (DE) ........................................ 101 01 367

(51) Int. Cl.[7] ................................................ C23C 16/14
(52) U.S. Cl. ...................................................... 427/299
(58) Field of Search ................................ 427/421, 426, 427/435, 443.2, 327, 299

(56) References Cited

U.S. PATENT DOCUMENTS 3,731,145 A 5/1973 Senay
4,275,383 A 6/1981 White et al.
4,505,430 A 3/1985 Rodgers et al.
5,065,692 A * 11/1991 Hollesen et al. ............ 118/302
6,081,281 A 6/2000 Cleary et al.

FOREIGN PATENT DOCUMENTS

| | | |
|---|---|---|
| DE | 825379 | 7/1949 |
| DE | 30 00 002 | 1/1980 |
| DE | 32 25 844 | 7/1982 |
| DE | 3504167 | 2/1985 |
| DE | 35 09 874 | 3/1985 |

* cited by examiner

*Primary Examiner*—Bernard Pianalto
(74) *Attorney, Agent, or Firm*—Lowe Hauptman Gilman & Berner LLP

(57) ABSTRACT

A spray system and a spraying method for coating liquids. An accessory liquid (10) wets the front, external surface's terminal zone (8) of the spray system (2) discharging the spray jet (6) of coating liquid, for instance the front terminal zone of the external periphery of a rotating atomizing bell (4), in order to prevent drying and layering of coating liquid (10) precipitated on the external surface.

21 Claims, 1 Drawing Sheet

SPRAYING METHOD AND A SPRAY SYSTEM FOR COATING LIQUIDS

TECHNICAL FIELD

The invention relates to a method for spraying and to a system for spraying a coating liquid.

BACKGROUND OF THE INVENTION

Spray systems comprising a rotary atomizing element in the form of a so-called bell to atomize and spray coating liquids onto an object to be coated are known from the U.S. Pat. Nos. 4,275,383 and 4,505,430; German patent documents 30 00 002 A1 and 35 09 874 A1. They disclose applying a high electrical potential, which may be positive or negative, to the rotary atomizers and/or to the spray coating liquid. Typically the high voltage is in the range of 4 kv to 140 kv. A high-voltage spray system fitted with an irrotational spray nozzle is known from U.S. Pat. No. 3,731,145.

Some spray particles of the sprayed coating material tend to migrate rearward from the spray jet and to precipitate on the front terminal outer surface zone of the spray system where they will cure and constitute a hard coating.

SUMMARY OF THE INVENTION

The objective of the invention is to prevent or at least reduce adhesion and curing/hardening and the ensuing coating, i.e. layering of the coating material on the front terminal outer surface zone of the spray system.

Accordingly the invention concerns a method for spraying coating liquids wherein such a coating liquid is sprayed from a liquid atomizer in the form of an irrotational nozzle or preferably in the form of a rotating, rotary atomizing element onto an object to be coated, and said method is characterized in that the terminal zone of an outer surface of the spray system delivering the spray jet of coating liquid is wetted with an accessory liquid in order to prevent or reduce layering of coating liquid precipitated on said surface.

The invention also concerns a coating-liquid spray system containing a liquid atomizer in the form of an irrotational nozzle or preferably in the form of a rotating rotary atomizing element to spray coating liquid onto an object to be coated, characterized in that it comprises a wetting unit to wet a front, terminal zone of the external surface of the spray system during spraying with an accessory liquid in order to prevent or delay drying and layering of coating liquid precipitated on said surface.

The invention offers the advantage that the accessory liquid prevents or strongly delays drying and layering of coating liquid on the spray system.

The wetting unit to wet the outer surface's front terminal zone with said accessory liquid preferably contains one or more boreholes or nozzles through which the accessory liquid—which illustratively is in the form of liquid drops or of an aerosol—is deposited in metered manner on the pertinent system component, for instance on rotating liquid atomizers.

In a further feature, the invention contains a cooling unit to cool at least part of the spraying system. Because of lowered temperature, drying or layering of the coating liquid on the outer surface's front terminal zone shall be prevented or much delayed. Accordingly cooling the outer surface's terminal zone enhances the effectiveness of the accessory liquid, namely to prevent or reduce drying and layering of coating liquid on said surface.

Preferably a cooling unit to cool the coolant shall be integrated into the spraying system. Preferably a compressed gas, for instance compressed air, shall be used as the coolant and it is cooled by the cooling unit and blown onto the cooling portion of the spraying system.

The voltage applied to the spraying system may be higher than ground or another predetermined reference potential on part or all of said system. The higher voltage may be constant or variable and it may be positive or negative relative to the reference voltage.

BRIEF DESCRIPTION OF THE DRAWINGS

The invention is illustratively elucidated below by means of a preferred embodiment and the attached drawings.

DETAILED DESCRIPTION OF THE INVENTION

Figure 1:
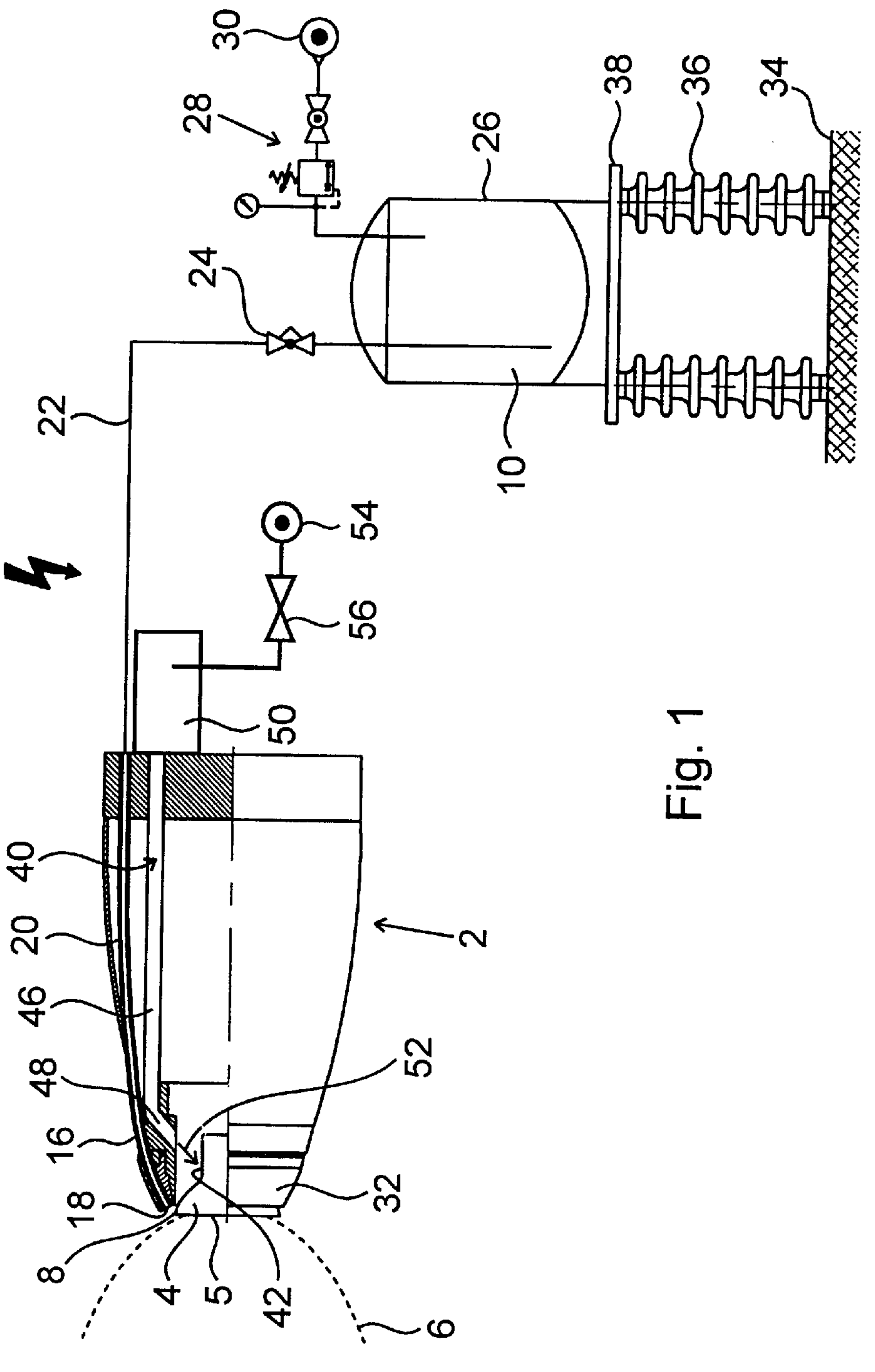
FIG. 1 is a schematic sideview, also shown partly in longitudinal section, of a spray system of the invention.
Figure 2:
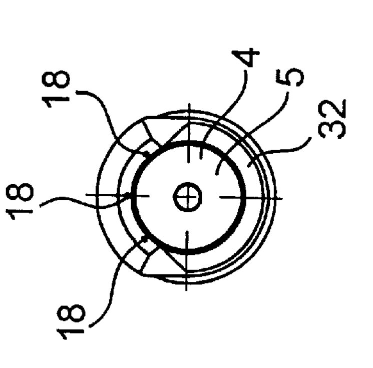
FIG. 2 is a front elevation of the left, front side of the spray system of FIG. 1.

The coating-liquid spray system 2 shown in FIGS. 1 and 2 contains a liquid atomizer in the form of an atomizing bell 4 driven by an omitted drive—preferably a compressed air turbine—at an angular speed high enough to spray the coating liquid in the form of a spray jet 6 onto an object to be coated. The coating liquid flows through the front side 5 of the atomizing bell 4.

The external surface's peripheral front terminal zone 8 of the atomizing bell 4 is wetted during spray coating with an accessory liquid 10. The accessory liquid 10 prevents or delays drying and layering of coating liquid that migrated back from the sprayjet 6 and precipitated on the external surface's front, peripheral zone 8. The accessory liquid 10 is metered through one or more discharge apertures 18 of a wetting unit 16 and is deposited on the external surface's front, peripheral terminal zone 8, for instance being applied drop-wise or in the form of an aerosol, for instance being applied as a spray. A liquid feed line 20 of the discharge apertures 18 is connected through an external supply line 22 containing a valve 24 to an accessory-liquid container 26. From- a compressed air source 30, compressed air is fed in controlled manner through a valve system 28 to the container 26 where it drives the accessory liquid out of said container 26 toward the spray system 2.

Preferably the accessory liquid shall be water when the coating liquid is water soluble, or it shall be a solvent when the coating liquid contains solvents.

As shown by FIG. 2, several, for instance three accessory liquid nozzles are configured as discharge apertures 18 across the external surface's front, terminal zone 8 in an air hood 32.

The feed system feeding coating liquid in the spray system to the atomizing bell 4 is omitted from the Figures because being known in the state of the art, for instance that of U.S. Pat. Nos. 4,275,838 and 4,505,430. Preferably a high voltage is applied to the atomizing bell 4, both the high voltage source and its connections being omitted form the Figures because being widely known.

To preclude sparkover from the spray system 2 onto the container 26 of the accessory liquid 10, both said container and the atomizing bell 4 shall be kept at the same high voltage and are configured on a bench 38 which is electrically insulated from the ground potential 34 by electric insulators 36.

Preferably the preferred embodiment also shall contain a cooling unit 40 to cool the front parts of the spray system 2, in particular to cool the front side 5 over which flows the coating liquid and to cool the front terminal zone 8 of the external surface of the atomizing bell 4. The cooling unit 40 feeds a coolant 52, preferably a cooled cooling gas, in particular compressed air, through a coolant line 46 to a coolant discharge 48 which points at the external peripheral surface 42 of the atomizing bell 4 behind latter's terminal zone 8 of the external surface, and thus this external peripheral surface 42 shall be cooled. The cold passes through the atomizing bell 4 to its front side 5. As a result, the temperature is lowered to ambient both at the external peripheral surface 42 of the atomizing bell 4 and on its front side 5, in order to prevent or at least reduce or delay a layer of coating liquid being formed on these surfaces.

A cooling unit 50 to cool the coolant 52 preferably is mounted directly on the spray system 2 or integrated into it. Consequently the cooled coolant only moves along short paths. Preferably the coolant is a compressed gas, such as compressed air from a compressed air source 54, and is fed through a coolant feed line 56 in metered manner to the cooling unit 50 and then is blown through the coolant discharge 48, illustratively in the form of one or more nozzles, onto the atomizing bell 4.

The cooling unit 50 may contain a so-called cooling cartridge to cool the coolant 52.

What is claimed is:

1. A method of spraying a coating liquid onto an object to be coated, said method comprising the steps of:

providing a spray discharging system having an atomizer for atomizing said coating liquid, said atomizer having a rear end and a front end, said atomizer longitudinally extending from the rear end to the front end and towards the object, the front end of said atomizer having an external surface, an internal surface that defines an inner passage for the coating liquid, and an atomizing edge at the boundary of the internal and external surfaces:

atomizing and spraying the coating liquid from the atomizing edge onto the object; and wetting the external surface of the front end of said atomizer in the vicinity of said atomizing edge by depositing an accessory liquid, either drop-wise or in the form of an aerosol, on said external surface in order to prevent or delay precipitation of the coating liquid on said external surface.

2. The method of claim 1, further comprising the steps of:

applying a non-zero voltage to said atomizer and rotating said atomizer during said atomizing.

3. The method of claim 2, further comprising the steps of supplying the accessory liquid from a container containing the accessory liquid to said external surface; and keeping said atomizer and said container at the same non-zero electrical voltage.

4. The method of claim 1, further comprising the step of cooling said atomizer during said spraying step by a cooling medium other than the accessory liquid.

5. The method of claim 4, wherein said cooling step comprises depositing the cooling medium on the rear end of said atomizer in a region longitudinally spaced from the vicinity of said atomizing edge.

6. A spray system for coating an object with a coating liquid, said system comprising:

a liquid atomizer for atomizing and spraying the coating liquid onto the object, said atomizer having longitudinally spaced rear and front end portions, the front end portion of said atomizer having an external surface, an internal surface that defines an inner passage for the coating liquid, and an atomizing edge at the boundary of the internal and external surfaces from which edge the coating liquid is to be dispensed as a spray;

a wetting unit having at least one discharge aperture located outside said inner passage and adjacent to the external surface and the atomizing edge of the front end portion for depositing an accessory liquid on said external surface in the vicinity of the atomizing edge in order to prevent or delay precipitation of the coating liquid on said external surface; and a cooling unit having a coolant line fitted with at least one cooling medium outlet pointing at the rear end portion of said atomizer in order to deposit a cooling medium onto said atomizer, wherein the discharge aperture of said wetting unit and the cooling medium outlet of said cooling unit are longitudinally spaced from each other.

7. The spray system as claimed in claim 6, wherein the wetting unit is configured to drip the accessory liquid onto said external surface.

8. The spray system as claimed in claim 6, wherein the wetting unit is a liquid sprayer.

9. The spray system as claimed in claim 6, further comprising the accessory liquid and the coating liquid wherein the coating liquid is soluble in the accessory liquid.

10. The spray system as claimed in claim 6, further comprising said cooling medium which is a compressed gas, wherein said cooling unit is a blower for blowing said compressed gas onto said atomizer.

11. The spray system as claimed in claim 6, wherein said atomizer is a rotary atomizing element.

12. The spray system as claimed in claim 11, wherein said at least one discharge aperture comprises a plurality of apertures asymmetrically positioned along the atomizing edge of the front end of said atomizer.

13. The spray system as claimed in claim 6, further comprising a container containing the accessory liquid and coupled to supply the coating liquid to said wetting unit, wherein said atomizer and said container have the same non-zero electrical voltage.

14. A spray system for coating an object with a coating liquid, said system comprising:

spraying means for spraying the coating liquid onto the object, said means comprising a hollow front terminal from which the coating liquid is to be sprayed, said front terminal having an external surface, an internal surface that defines an inner passage for the coating liquid prior to being sprayed, and an edge at the boundary of the internal and external surfaces; and wetting means for spraying or dripping an accessory liquid on said external surface in the vicinity of said edge of the front terminal during the spraying operation of said spraying means in order to prevent or delay precipitation of the coating liquid on said external surface during the spraying operation.

15. A method of spraying a coating liquid onto an object to be coated, said method comprising the steps of:

providing a spray discharging system having a front terminal facing the object;

delivering the coating liquid to said spray discharging system;

spraying the coating liquid from the front terminal onto the object; and wetting an external surface of the front terminal by depositing, in a metered manner, an accessory liquid on said external surface in order to prevent or delay precipitation of the coating liquid on said external surface;

wherein said wetting is performed during said spraying.

16. The method as claimed in claim 15, further comprising the step of cooling said front terminal, during said spraying step, by a cooling medium other than said accessory liquid.

17. The method as claimed in claim 16, wherein the cooling medium is one of a compressed gas and compressed air.

18. The method as claimed in claim 15, wherein said depositing step comprises dripping the accessory liquid on said external surface.

19. The method as claimed in claim 15, wherein said depositing step comprises depositing the accessory liquid in the form of an aerosol onto said external surface.

20. The method as claimed in claim 15, wherein the front terminal comprises a nozzle having a front end facing the object, and said depositing step comprises depositing the accessory liquid on an external peripheral surface of said front end.

21. The method as claimed in claim 15, further comprising selecting the accessory liquid so that the coating liquid is soluble in the accessory liquid.

* * * * *